(12) United States Patent
Srinivasan

(10) Patent No.: US 6,992,486 B2
(45) Date of Patent: Jan. 31, 2006

(54) RADIO FREQUENCY COIL FOR RESONANCE IMAGING ANALYSIS OF PEDIATRIC PATIENTS

(75) Inventor: Ravi Srinivasan, Beachwood, OH (US)

(73) Assignee: Advanced Imaging Research, Inc., Cleveland, OH (US)

( * ) Notice: Subject to any disclaimer, the term of this patent is extended or adjusted under 35 U.S.C. 154(b) by 29 days.

(21) Appl. No.: 10/722,760

(22) Filed: Nov. 26, 2003

(65) Prior Publication Data

US 2004/0075437 A1 Apr. 22, 2004

Related U.S. Application Data

(63) Continuation-in-part of application No. 10/440,054, filed on May 16, 2003, now abandoned.
(60) Provisional application No. 60/381,160, filed on May 16, 2002, and provisional application No. 60/429,912, filed on Nov. 29, 2002.

(51) Int. Cl.
*G01V 3/00* (2006.01)

(52) U.S. Cl. ...................................... 324/318; 324/309
(58) Field of Classification Search ................. 324/318, 324/319, 322, 309, 307, 300; 128/653; 600/407
See application file for complete search history.

(56) References Cited

U.S. PATENT DOCUMENTS

| | | | |
|---|---|---|---|
| 4,411,270 A | 10/1983 | Damadian | |
| 4,467,282 A | 8/1984 | Siebold | |
| 4,707,664 A | 11/1987 | Fehn et al. | |
| 4,751,464 A | 6/1988 | Bridges | |
| 4,783,641 A | 11/1988 | Hayes et al. | |
| 4,793,356 A | 12/1988 | Misic et al. | |
| 5,525,905 A | 6/1996 | Mohapatra et al. | |
| 5,602,479 A * | 2/1997 | Srinivasan et al. | 324/318 |
| 5,619,996 A | 4/1997 | Beresten | |
| 5,823,960 A | 10/1998 | Young et al. | |
| 5,990,681 A | 11/1999 | Richard et al. | |
| 6,029,082 A * | 2/2000 | Srinivasan et al. | 600/422 |
| 6,177,797 B1 * | 1/2001 | Srinivasan | 324/318 |
| 6,366,798 B2 | 4/2002 | Green | |
| 6,611,702 B2 | 8/2003 | Rohling et al. | |
| 2004/0075437 A1 | 4/2004 | Srinivasan | |

FOREIGN PATENT DOCUMENTS

| | | |
|---|---|---|
| WO | WO 0098/48756 | 11/1998 |
| WO | 02/083053 | 10/2002 |

* cited by examiner

*Primary Examiner*—Brij B. Shrivastav
(74) *Attorney, Agent, or Firm*—Renner, Otto, Boisselle & Sklar, LLP

(57) ABSTRACT

A radio frequency (RF) pediatric coil for magnetic resonance/imaging analysis is disclosed. The coil includes a first end ring having a generally annular opening, and at least one of a second end ring and an end cap. An anterior extension is formed on the first end ring and on the at least one of the second end ring and the end cap. A plurality of elongated segments are coupled to and positioned circumferentially around the first end ring and the at least one of the second end ring and the end cap to form a coil volume. A first elongated segment and a second elongated segment are spaced about the anterior extension to facilitate access into the coil volume. The coil can be implemented as a standalone coil, or it can be operatively coupled to an incubator to increase the resolution of magnetic resonance scans of a neonate inside the incubator.

35 Claims, 13 Drawing Sheets

Section A-A

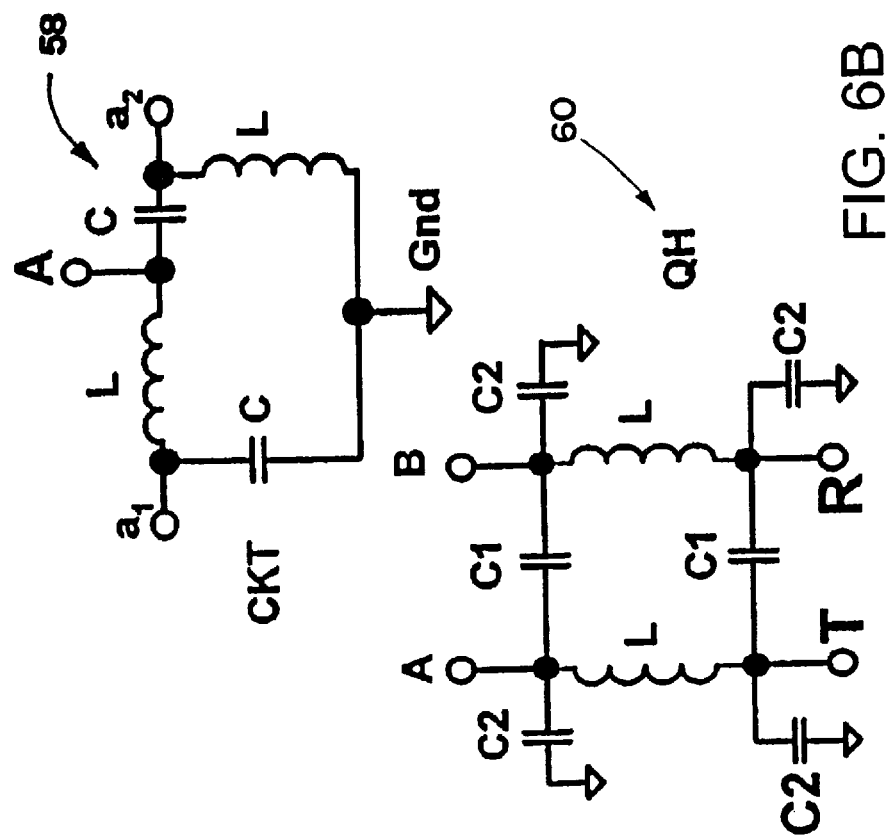
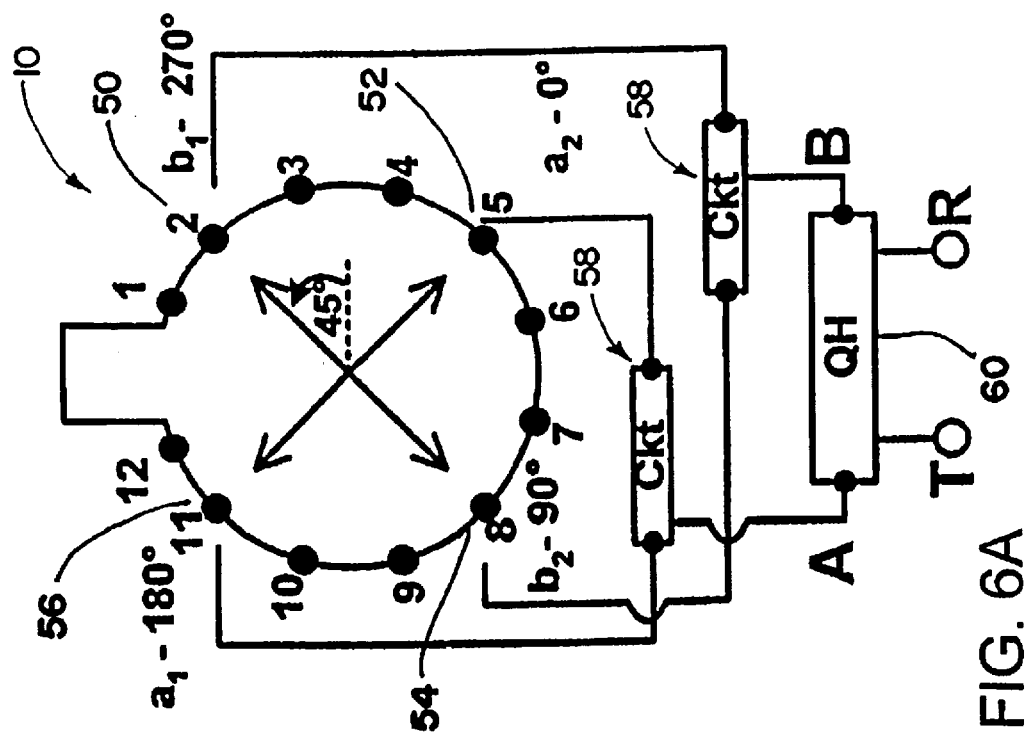
FIG. 6B
FIG. 6A

RADIO FREQUENCY COIL FOR RESONANCE IMAGING ANALYSIS OF PEDIATRIC PATIENTS

CROSS REFERENCE TO RELATED APPLICATIONS

This Application claims priority from U.S. Provisional Application Ser. No. 60/429,912 filed on Nov. 29, 2002 and is a continuation-in-part of application Ser. No. 10/440,054 filed May 16, 2003, now abandoned, which claims priority from U.S. Provisional Application Ser. No. 60/381,160 filed on May 16, 2002.

TECHNICAL FIELD

The present invention relates to a magnetic resonance imaging system and a life sustaining incubator system used for ill neonates. Specifically, the invention relates to a radio-frequency (RF) coil and method for use in such systems. More specifically, the invention relates to an RF coil and method for use with a magnetic resonance imaging compatible incubator (MRCI) in a magnetic resonance imaging system.

BACKGROUND

NMR or MRI

In Magnetic Resonance Imaging (MRI) systems and nuclear magnetic resonance (NMR) systems, a static magnetic field (B) is applied to the body under investigation. The magnetic field defines an equilibrium axis of magnetic alignment in the region of the body under investigation. An RF field is applied in the region being examined in a direction orthogonal to the static field direction, to excite magnetic resonance in the region, and resulting RF signals are detected and processed. Generally, the resulting RF signals are detected by RF coil arrangements placed close to the body. See for example, U.S. Pat. No. 4,411,270 to Damadian and U.S. Pat. No. 4,793,356 to Misic et al. Typically, these coils are either surface type or volume type coils, depending on the application, and are used to transmit RF and receive NMR signals from the region of interest (ROI).

A further increase in signal to noise ratio (S/N) can be realized with the use of quadrature coils (as opposed to the conventional linear coil design). See for example U.S. Pat. No. 4,467,282 to Siebold and U.S. Pat. No. 4,707,664 to Fehn. Also, for highly homogeneous and quadrature volume coils (commonly referred to as the birdcage and the transverse electromagnetic (TEM) wave resonators, respectively), see U.S. Pat. No. 4,783,641 to Hayes, U.S. Pat. No. 4,751,464 to Bridges, and U.S. Pat. No. 6,029,082 to Srinivasan et al..

Birdcage Coil

The birdcage coil is well known in the art and includes two end rings connected by several straight segments, which are referred to as legs. The birdcage coil has several resonance modes, of interest being the principal k=1 mode for homogeneous imaging. The principal mode has two linear modes, oriented orthogonal to one another. The outputs from these modes can be combined using analog circuitry or digitally combined in a receiver system. The birdcage coil provides about a 41% improvement in S/N and expends about one-half of the power of a conventional linear coil.

In addition, owing to the sinusoidal currents in the coil periphery, the birdcage coil provides a highly homogeneous B field in the transverse planes (XY) inside the coil, which is ideal for imaging (e.g., whole-body, head, knee, wrist, etc. for adults). The B field profile along the coil axis, however, mimics a Gaussian distribution with a maximum at the coil center.

The B field distribution is improved over the adult head with an end-capped design disclosed by Hayes (see, e.g., Book of Abstracts, p 39–40, 5$^{th}$ ISMRM, 1986). The end-capped design provides a more uniform distribution toward the top of the head. At the open end along the coil axis, the B field distribution for the end-capped coil design falls off like a conventional birdcage, which is ideal for imaging the adult head.

Neonate Incubator

Incubators are commonly used in hospitals in the neonatal intensive care units (NICUs) as life sustaining devices for the ill neonate. These incubators help to maintain the micro-environment of the ill neonate with high levels of temperature (up to 39 deg C.), humidity (up to 100%) and oxygen (up to 100%) prescribed by the doctor and required by the patient. Generally, mildly ill neonates are transported to the magnetic resonance (MR) scanner and placed inside the super cooled MR system for diagnosis. No effort is made to maintain the micro-environment surrounding the patient to the original NICU conditions inside the incubator. This is due to the unavailability of an incubator system that is MRI compatible.

Recently, a submission was made to the European Patent Office (see EP 01 109 195.6, filed Apr. 12, 2001 and PCT Application WO 02-083053A1, filed Apr. 12, 2001) by Lonekker-Lammers et al. (Lonekker) for an incubator/transporter system that is MRI compatible. With the MRCI of Lonekker, safe transport is possible between the NICU and the MRI sections. Further, the neonate is left untouched inside the incubator when scanned inside the MRI system. Once the MRI scan is complete, the patient is transported back to the NICU in the same incubator system. Thus, the incubator settings (e.g., temperature, humidity, oxygen) are not altered and the environment of the neonate is not disturbed.

In summary, the Lonekker MRCI performs similar to the conventional NICU transport incubator with the added feature of MRI compatibility. The added feature provides the clinicians the necessary diagnostic information which may lead to prompt clinical/pharmacological/surgical interventions, which in turn can save precious lives.

MRI is a diverse imaging tool commonly used in the diagnosis/prognosis of illnesses in the pediatric population. MRI diagnosis, however, depends on image quality. For a particular field strength, high image qualities over the ROI can be achieved with a high S/N RF coil.

At present, neonates are imaged using adult coils inside the super cooled MR scanner without the incubator. Should the incubator be used inside the MR scanner, the S/N of the MRI experiment will greatly suffer due to the larger adult size coils, which encompass the incubator. Specialty RF coils must be used to attain optimum S/N and imaging resolution. Further, the coils must withstand the harsh environment (high temperature, high levels of humidity and oxygen) within the incubator. In addition, the design must allow rapid positioning/removal over the patient pre/post MR scan and must allow placement of endo-tracheal tubes (ett) and similar devices (e.g., ventilator tubes) attached to the patient.

By using a coil within the incubator, high image S/N and thereby high image quality can be realized in reasonable scan times. With the improved S/N, one can increase the imaging resolution or reduce the scan time, thereby reducing patient risks while concomitantly increasing throughput in an MR scanner.

A whole body RF coil was designed by Dumoulin et al. for a prototype incubator (see Dumoulin et al "A Self-contained neonate incubator for use with MR scanners" in Proc. ISMRM Scientific Meeting, 10 (2002), p 2558, Abstract). Dumoulin's coil is large and is used to scan the brain and torso of the neonate. The coil has 8 legs that extend out radially to connect to the end rings. Since this coil has a large volume, low filling factors are realized, which can result in non-optimum S/N over the imaging volume.

Accordingly, there is a need in the art for an RF coil that can be used with an MRCI that provides optimum S/N and imaging resolution. In addition, it would be advantageous for the coil design to allow rapid positioning/removal over the patient pre/post MR scan and to allow placement of endo-tracheal tubes (ett) and similar devices (e.g., ventilator tubes) attached to the patient. Further, it would be advantageous for the coil to withstand the harsh environment commonly found in an incubator (e.g., high temperature, high levels of humidity and oxygen).

The present invention is intended to enhance the S/N of the MRI RF coil system over pre-, term- and post-term pediatric head and body (age 0–3 months). In addition, the present invention is intended for use within the MR compatible incubator (MRCI) without significantly sacrificing its performance or the performance of the incubator.

SUMMARY OF THE INVENTION

An object of the present invention is to provide an RF coil with high S/N over the pediatric head. Another object of the present invention is to provide an RF coil with high S/N that is safe for use with an incubator inside an MR system.

A first embodiment is directed to a head RF coil specific for use with pre-, term and post-term born newborns and for use on infants, for example, up to 3 months of age. Further embodiments can be realized for imaging the torso (heart, liver, spleen, etc.) and the upper/lower extremity of the infant.

As is known in the art, infants are placed in incubators after birth for various reasons, such as pre-mature birth, physical abnormalities, etc. The incubator protects the infant from the surrounding environment, which may be harmful to the infant's well-being. In diagnosing the infant's medical condition, it often is necessary to obtain an MRI of a region of the infant's body. Generally, this requires the infant be removed from the incubator, thus removing the infant from the controlled environment.

The RF coil of the present invention facilitates obtaining MR scans of an infant who is in an incubator without removing the infant from the incubator. For example, the infant is transported in an MR compatible incubator from the NICU to the MRI room. Once transported, an RF coil in accordance with the present invention is positioned inside the MR compatible incubator and over a region of the infants body, e.g., the infant's head. A scan of the region is obtained and, upon completion of the scan, the RF coil is moved back and/or removed from the incubator and the patient is transported back to the NICU. During the entire process, the infant remains inside the incubator and thus is in a controlled micro-environment having prescribed temperature, humidity and oxygen levels. Moreover, the RF coil of the present invention provides a higher S/N compared to adult RF coils, and thus increased image quality.

It is important to note that the pediatric patients intended to be scanned with the RF coil of the present invention may be very tiny and can weigh up to 5000 grams. An FDA limit for RF power deposition states that the power dissipated over a head shall not exceed 3 watts per kilogram. For a 1200 gram infant, the head, neck and upper chest/shoulders will weigh approximately 480 grams (roughly 40% of body weight). Thus, one must not use more than 1.5 watts over the head for a patient weighing 1200 grams. Therefore, a smaller coil will be more efficient and will expend less RF power than the adult head coil. This necessitates the development of a scaled down custom head coil for the tiny pediatric patient.

A custom RF coil for the newborn brain will result in an efficient operation, will use a fraction of the power currently used by adult head coils, will minimize image artifacts from neighboring anatomies (neck, chest, shoulders) and will provide high S/N and resolution sought by the clinician for effective diagnosis of the illnesses. Further, the additional S/N can be used to reduce the scan time and therefore reduce the patient stay inside the MR scanner (away from the NICU). With the coil disclosed in the present application, optimum imaging over the pediatric brain can be achieved while remaining below the FDA power guidelines mentioned above.

RF Coil Design Considerations

1) All coils must withstand the relatively high temperature (up to 39 deg C. as opposed to room temperature of 25 deg C.), high levels of humidity (up to 100%) and varying amounts of enriched oxygen (up to 100%) inside the incubator.

2) RF coils must be large enough to accommodate the sick patient connected to one or more tubes for incubation.

3) Coils must provide high S/N over the imaging field of view (FOV).

4) Coils must not impair the incubator functions and must be easy to use.

To address the relatively high temperature, high levels of humidity and varying amounts of enriched oxygen, plastic composites are chosen to build the RF coil that are thermally stable, have a low moisture absorption coefficient and do not react with oxygen. Coil enclosures are made with close tolerances to attain a press-fit between male and female components. There are no holes in the RF coil that expose the coil to the patient. This is necessary to eliminate leakage of oxygen and moisture (caused due to high humidity) from reaching the high voltage components (e.g., tuning and matching capacitor) of the coils. The front end ring and end cap of the coil are sealed with an encapsulant that is safe for use with electrical components and suitable for use with MRI.

The encapsulant preferably have high dielectric strength (>400 volts per mil, 1 mil =0.001"), high dielectric constant, low thermal expansion coefficient, low water absorption, high volume resistivity, and should cure at room temperature. In addition, the encapsulant and enclosure should not significantly affect coil tuning or coil quality factor (Q) values.

For example, three encapsulants which satisfied all of the above criteria are urethane based UR-324, silicon based SC-102, and epoxy based ES-100. The shift in coil tuning with each encapsulant is less than 1 MHz at the NMR frequency of 64 MHz, and the coil Q remains virtually the same. Further, comparing the performance of two near identical coils (one sealed, one unsealed) results in virtually no noticeable difference in coil performance. S/N of both coils are within 5%, which is within the MRI equipment tolerances for S/N. In all cases, when MR images are noticed for artifacts caused due to the encapsulant, primarily on weak signal scans that use short T2 (spin-spin realization time), e.g., echo time (TE) of about 3–4 ms), very little or no artifacts were witnessed.

The legs of the coil are covered with fiberglass tubes capable of withstanding the environment of the incubator. All of the electronics in the vicinity of the end-cap are sealed including the cable outlets pointing toward the rear of the incubator (see FIG. 3).

To address the requirement for accommodating sick patients connected to one or more tubes for incubation, the dimension of the coil is chosen to include 95th percentile of the patient population up to 3 months of age, for example. Extra space is provided in the anterior section toward the front end to allow room for endo-tracheal and ventilator tubes to be connected to the patient during the scan (see FIG. 3).

To address the need for high S/N over the imaging field of view (FOV), the birdcage design is chosen to provide a high S/N and high degree of RF homogeneity over the pediatric head owing to its quadrature operation ($\sqrt{2}$ improvement in S/N) and sinusoidal current distribution.

Finally, to facilitate incubator functions and provide ease to use, the coil is designed with virtually no perturbation of air flow to the patients face alongside the length of the patient. The head coil (see FIG. 3) is slid in to the incubator via a rear flap (not shown) prior to the scan and removed after the MRI scan without disturbing the patient. The coil is held still during scanning to eliminate ghosting artifacts caused due to vibration. The coil is held in place during the scan with rubber bushings attached to the coil using the incubator flap. The easy ON, easy OFF feature of the coil design is extremely useful when scanning sick neonates inside the incubator without significantly disturbing the environment (temperature, humidity, oxygen levels) inside the incubator.

According to one aspect of the invention, the invention is directed to a radio frequency (RF) pediatric coil for magnetic resonance/imaging analysis. The RF coil includes: a first end ring having a generally annular opening; at least one of a second end ring and an end cap; an anterior extension formed on the first end ring and on the at least one of the second end ring and the end cap; and a plurality of elongated segments coupled to and positioned circumferentially around the first end ring and the at least one of the second end ring and the end cap to form a coil volume, wherein a first elongated segment and a second elongated segment are spaced about the anterior extension to facilitate access into the coil volume.

Another aspect of the invention relates to an imaging system for magnetic resonance imaging/analysis of a neonate. The system includes: an incubator; a platform for restraining the neonate, said platform residing within the incubator; and the RF pediatric coil for magnetic resonance imaging, wherein the coil is operatively coupled to the platform to facilitate positioning of the coil relative to the neonate.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

BRIEF DESCRIPTION OF DRAWINGS

These and further features of the present invention will be apparent with reference to the following description and drawings, wherein:

FIG. 6A is a schematic diagram of the coil of FIG. 3 illustrating the drive points and the signal generation in accordance with an embodiment of the present invention;

FIG. 6B is a schematic diagram of a push-pull circuit and a quadrature hybrid combiner used in FIG. 6A in accordance with an embodiment of the present invention;

DISCLOSURE OF INVENTION

Figure 1:
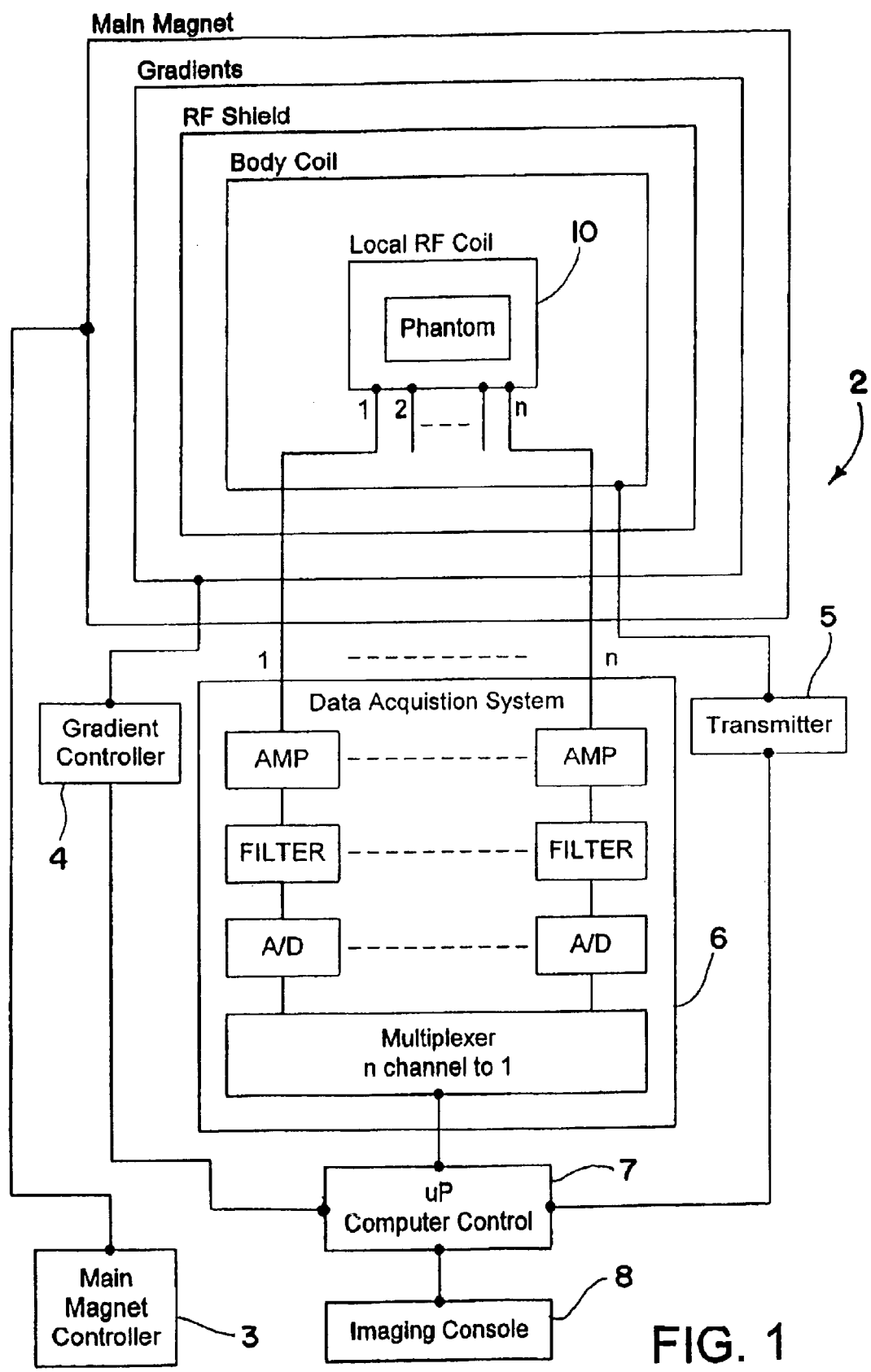
FIG. 1 is a block diagram of a system incorporating a coil in accordance with the present invention.

The following is a detailed description of the present invention with reference to the attached drawings, wherein like reference numerals will refer to like elements throughout.

Referring to FIG. 1, a block diagram of an MR system 2 that may be used in conjunction with an incubator and RF coil in accordance with the present invention is shown. The MR system 2 includes a main magnet controller 3, a gradient controller 4, a transmitter 5 and a data acquisition system 6, as is conventional. A computer controller 7 controls the operation of the system, and system data is provided to a user through an imaging console 8. The coil 10 sends and receives data to/from the data acquisition system 6.

Figure 2:
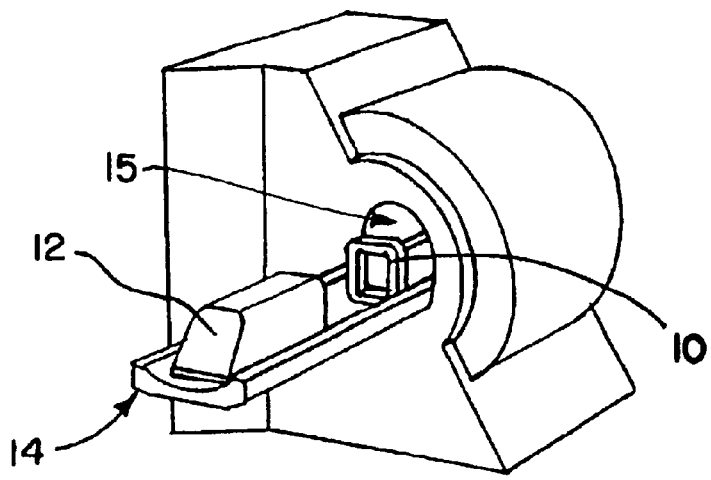
FIG. 2 is an isometric view of an MR system incorporating a coil in accordance with an embodiment of the present invention.

Moving to FIG. 2, a rendering of an MRCI 12 on an MRI patient table 14 is shown. The RF coil 10 can be seen on one end inside the incubator 12, near a magnet bore 15 of the MRI system 2.

Figure 3:
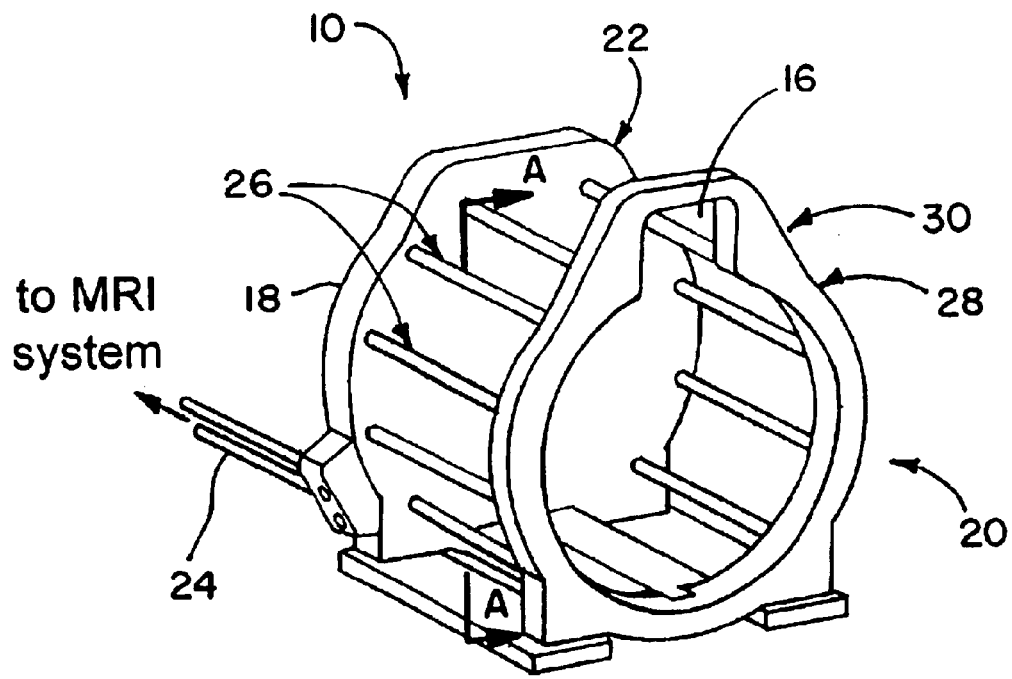
FIG. 3 is an isometric view of a birdcage coil in accordance with an embodiment of the present invention.

Referring to FIG. 3, the preferred embodiment includes an end-capped asymmetric head coil 10 of the low-pass configuration with clearances 16 for the nurse to have access to the patient and while accommodating life sustaining endotracheal/ventilator tubes attached to the ill pediatric patient.

The head RF coil 10 has an end-cap 18 similar to the coil of Hayes to improve the field distribution over the brain of the infant. The radial end cap is similar in axial (XY) cross-section to the front of the coil 20 except for an anterior extension 22. The circular end cap extends along the coil axis toward the back which helps minimize shield currents on the ground of the cables 24 exiting the coil 10 and the incubator system.

The cross-sectional diameter and length of the twelve section RF coil 10 is chosen to include 95th percentile of the patient population up to 3 months of age, e.g., up to 40 centimeters head circumference. The legs 26 in the anterior section are spaced apart azimuthally by 45 degrees to allow a nurse/doctor access to the patient's face. The end ring 28 of the birdcage anterior to the patient is curved in such a way so as to allow placement of life sustaining lines such as an endo-tracheal tube or ventilator tubes to be attached to the patient at all times (during patient transport, for example, between NICU and MRI sections and during MR scan). Gap width and height of the extension 30, for example, is 51 mm and 37 mm respectively.

Figure 4:
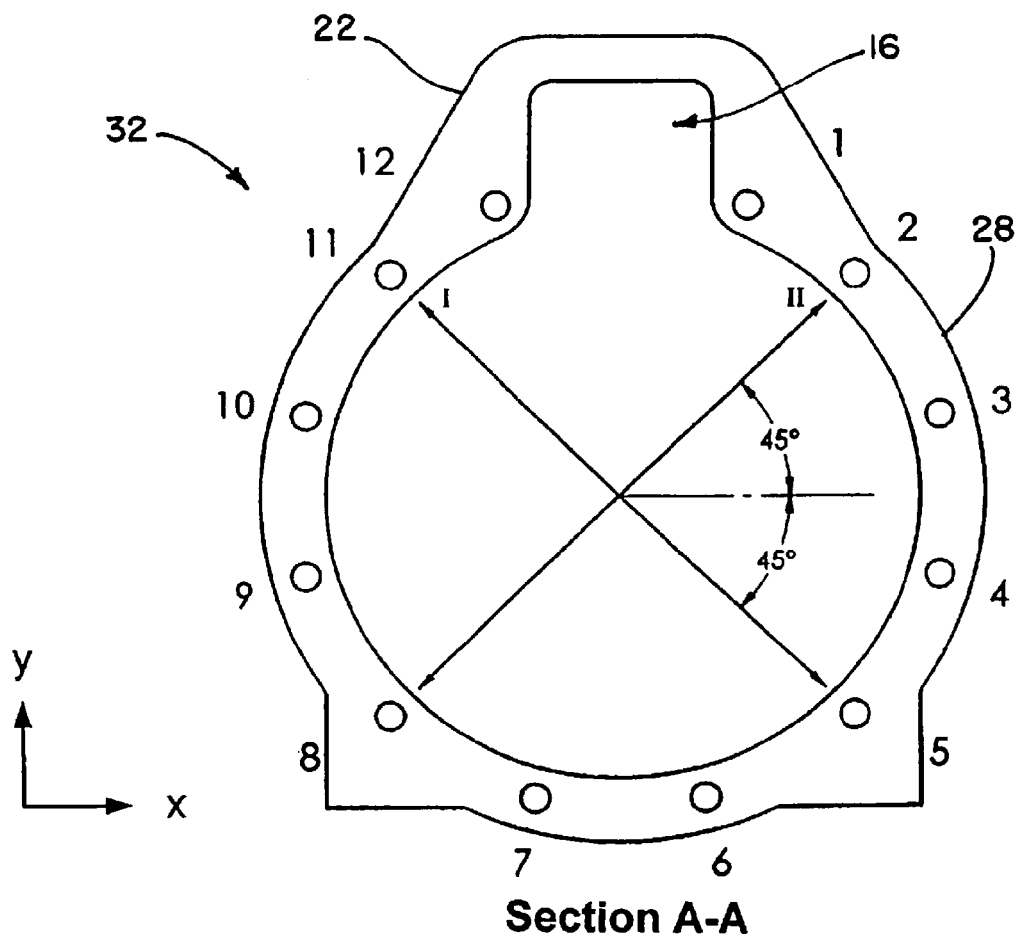
FIG. 4 is a cross sectional view of the birdcage coil of FIG. 3.

A cross-sectional view 32 of the front end-ring 28 with physical locations of the legs 26 and the alignment of the principal modes (I, II) is shown in FIG. 4. As seen, the principal modes are driven symmetric to the head to realize relatively high but equal Q values and hence optimal S/N.

Figure 5:
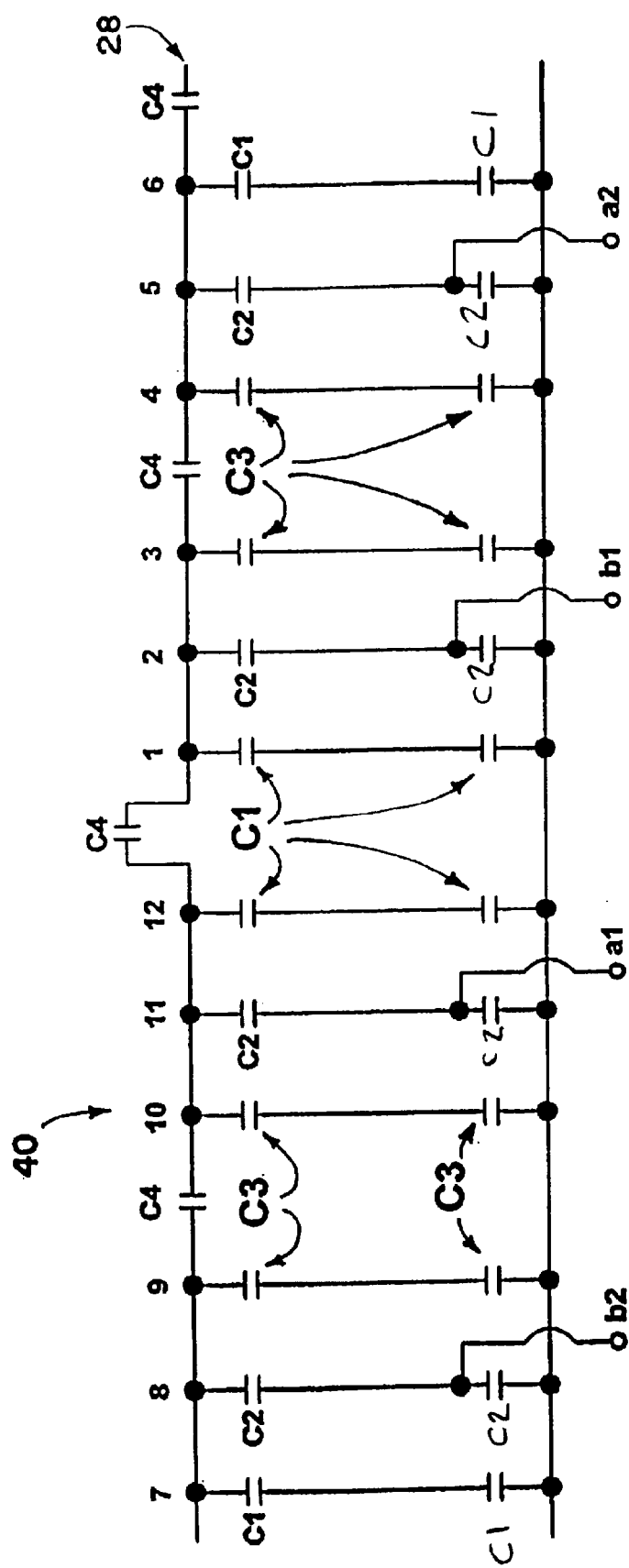
FIG. 5 is a planar schematic diagram of the coil of FIG. 3 showing the capacitor values of the coil.

A planar schematic 40 of the coil 10 of FIG. 3 is shown in FIG. 5. Capacitor values (C1=41.8 pF, C2=40.1 pF, C3=34.1 pF, for example) are chosen such as to provide a sinusoidal current distribution over the coil periphery necessary for providing a high S/N and maintaining a high degree of RF uniformity over the pediatric head. Respective phase shifts are maintained in the coil individual sections based on their physical location, so symmetric mode alignment and drives (a1, a2 and b1, b2) can be realized over the head. This aspect has been confirmed by obtaining spin echo images on a homogeneous phantom and on a patient.

High RF shorting capacitors (C4=0.1 uF, 0.01 uF, 0.001 uF, for example) are used on the front end ring 28 to eliminate gradient induced eddy currents. Likewise, the end cap 18 is broken into smaller sections and several high value RF shorting capacitors are used to bridge the smaller sections (not shown). By doing so, the RF integrity of the end cap 18 is maintained and the coil 10 produces no visible artifacts due to eddy currents usually caused by fast switching time varying gradients.

The coil 10 is driven symmetrically at four points at ±45 degrees as shown in FIG. 6A. This symmetric feed provides a high S/N and a high degree of RF uniformity over the imaging ROI. Four-point feed is achieved using a push-pull configuration, which is shown in more detail in FIG. 6B. Drive points a1 and a2, b1 and b2 are bridged using the push-pull configuration 58 and their outputs are combined with a 3 dB quadrature hybrid combiner 60. A characteristic impedance of fifty ohms is used for the phase-shifter push-pull circuit 58 and the quadrature hybrid combiner 60.

During transmit, the power is incident to the coil 10 through the T port of the hybrid combiner 60. This transmit power is split into two (A, B) in the quadrature hybrid and fed to the coil 10 in four places (a1, a2, b1, b2) via the phase-shifter push-pull circuit 58. During receive, NMR signals from the two linear modes of the coil (I, II) are combined using the same push-pull circuit and approach the NMR receive via the R port of the quadrature hybrid 60, due to the NMR reciprocity principle. Matching the coil to fifty ohms can be accomplished in the four locations a1, a2, b1, b2 by using reactive elements.

Second Embodiment

Figure 7:
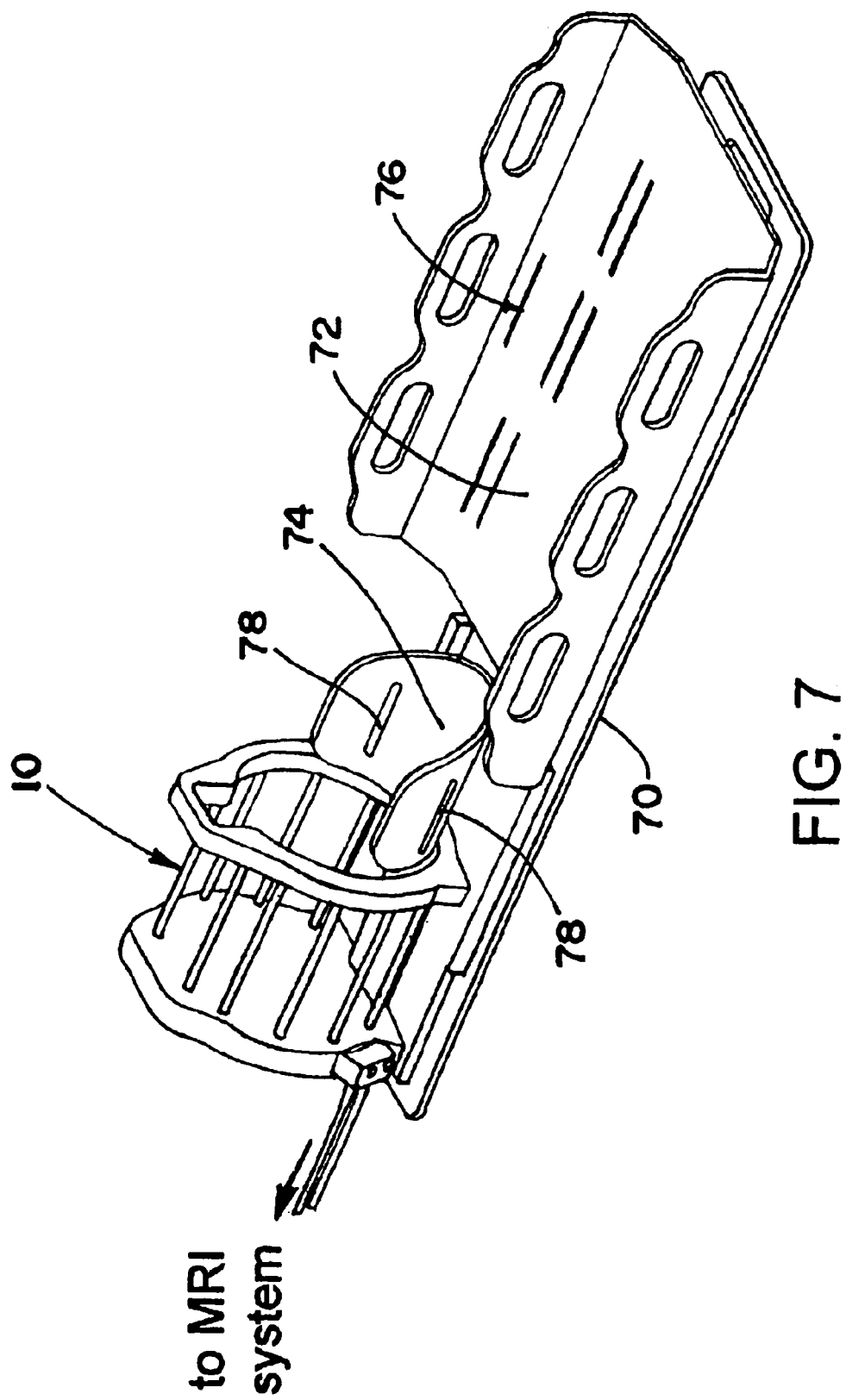
FIG. 7 is an isometric view of a portion of an MR system incorporating a head coil in accordance with another embodiment of the present invention.

Referring to FIG. 7, the second embodiment shows the coil 10 on a base plate 70 that supports the patient in a cradle shaped structure 72 while the patient is being scanned. This set up can be used despite the incubator being a stand alone imaging device.

As shown in FIG. 7, the coil 10 is positioned far back away from the patient head rest 74. The patient is placed on the cradle support 72 (length 664 mm, width 332 mm, height 96 mm, for example) and held with straps via slots 76 if needed to keep the patient still during scanning. The head of the patient can also be held still using a soft velcro strap (not shown) via the two slots 78 shown on the head rest 74 (156 mm long, for example). A soft pad (not shown) can be placed between the patient and the support shown here for added comfort. Once the patient is placed on the cradle and is cooperative, the RF coil 10 is slid over the head for scanning. Once the scan is finished, the coil 10 is quickly slid back and the patient removed from the MR table. Restraining mechanisms such as velcro straps may be added as needed to hold the head, chest, arms, torso and feet of patients. In addition, some patients may be sedated using doctor prescribed sedatives during transport and the MR scan. Total length and height of the base plate is 876 and 134 mm, for example.

Embodiment 3 —Neonate Body Coil

Figure 8:
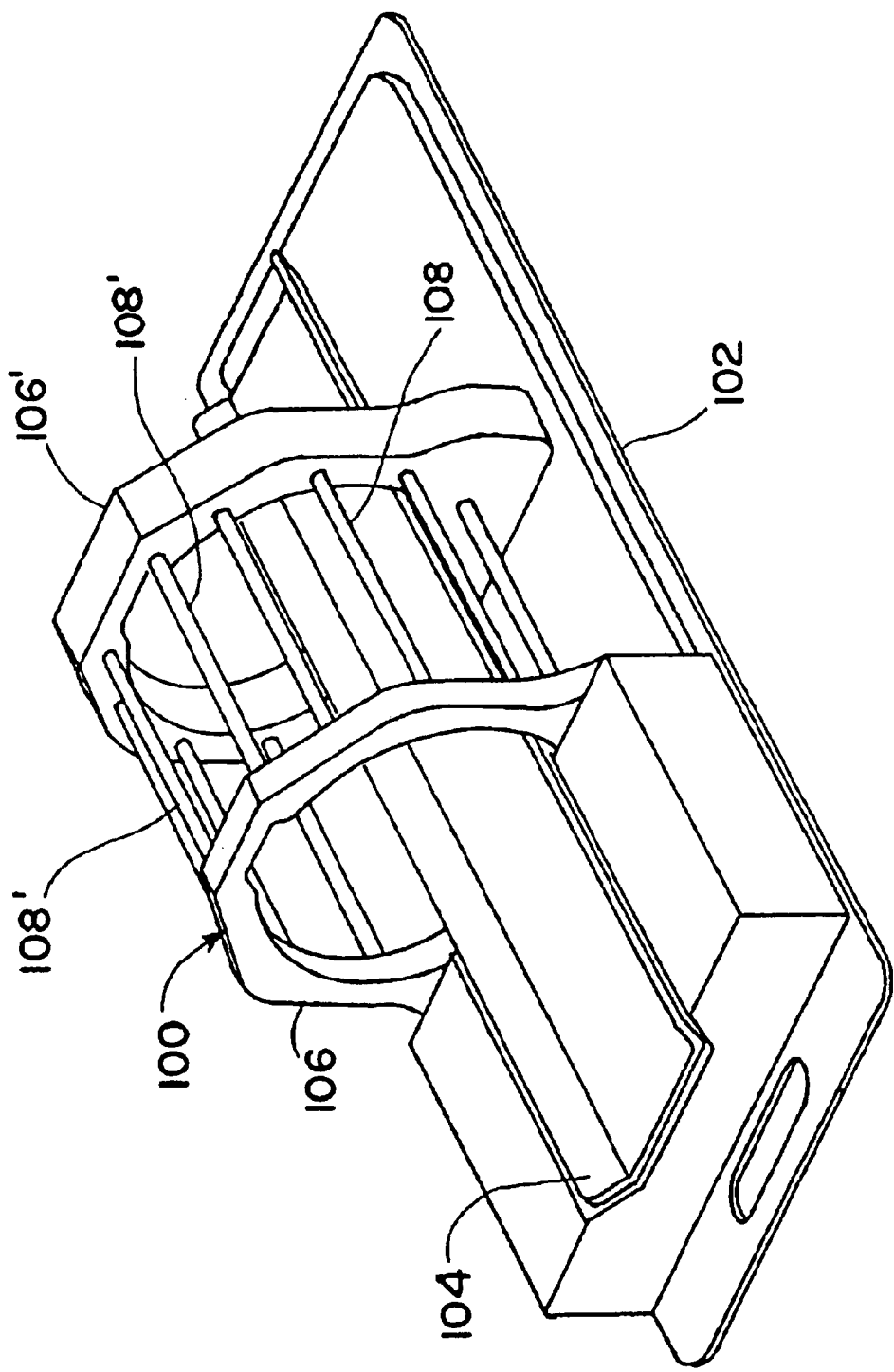
FIG. 8 is an isometric view of a neonate body coil and base in accordance with another embodiment of the present invention.

FIG. 8 is a 3D rendering of a neonate body coil 100 with base 102. The body coil 100 is placed OFF the base 102 closest to a magnet bore 15 (FIG. 2) on the MR patient table 14. The patient is placed on a cushion pad 104 over the base 102 and held with cushions and straps (not shown) for support, comfort and immobilization during the MR examination. The coil 100 then is slid forward over the anatomy of interest.

For cardiac imaging, the patient is placed head first (head closest to the magnet) and supine, whereas for imaging the pelvis, the patient is placed feet first and supine (feet closest to the magnet facing into the magnet bore 15). In each case, the coil 100 is slid over the anatomy of interest. Thus, patient placement is determined by the section of the anatomy that is to be imaged.

Figure 11:
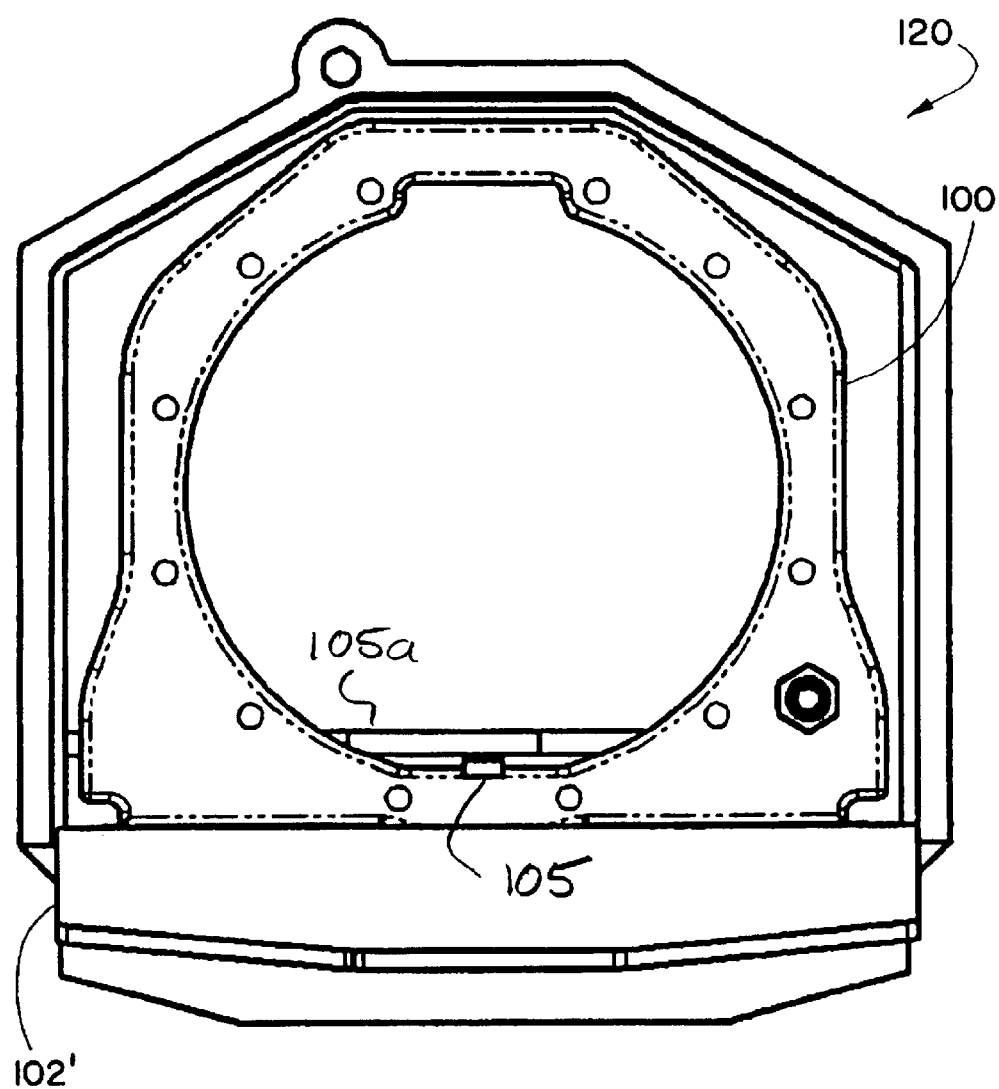
FIG. 11 is a cross sectional view of the neonate body coil inside an MR compatible incubator.

With further reference to FIG. 11, the neonate base 102 includes a sturdy cantilever mechanism 105 that holds the neonate still. The body coil 100 is slid in a straight line over the anatomy of interest with the help of rails on the base (not shown). The rails guide the body coil 100 as it moves along the base 102 and hold the body coil still during imaging. The body coil has a beam 105a inside that lifts the cantilever mechanism 105 slightly and holds the body coil 100 in place during imaging. The beam can be made of a plastic material, such as Delrin, for example. The beam serves as a support for the cantilever mechanism 105 and reduces vibration (and hence vibration artifacts) during imaging. The cantilever mechanism 105 is made of a material that slides smoothly over the beam, e.g., a plastic material, such that the coil can be moved without any impulse or jerk over the patient.

The neonate base 102 has four straps (one for head and feet and two for the torso) to hold the neonate still during the MR experiment. Pads are designed to comfort the subject while holding them still during imaging. A forehead pad and body pads can be provided to isolate the patient from the straps.

The body coil 100 shown in FIG. 8 has two end rings 106, 106' connected by twelve straight segments 108 (legs). Coil diameter and length are adequate to include 95th percentile of the newborn patient population up to 3 months of age and, for example, are 8.375" and 7.25" respectively. The end rings 106, 106' of the body coil 100 are shaped accordingly to accommodate an infant attached to life sustaining equipment (e.g., ventilator, anesthesia) and vital signs monitoring equipment (e.g., electrocardiogram, pulse oximeter, etc.). The two legs 108' toward the top of the coil 100 are moved sideways (e.g., approximately 7.5 degrees each azimuthally) and the end rings 106, 106' are extended outward in a bridge like fashion (e.g., 2" wide, ½" high) so as to allow patient access by a nurse, visualization of the patient's face using a camera, and to accommodate tubes (e.g., nasal canula, ventilator tubes, endo-tracheal tubes) that may be connected to the patient all times.

Figure 9:
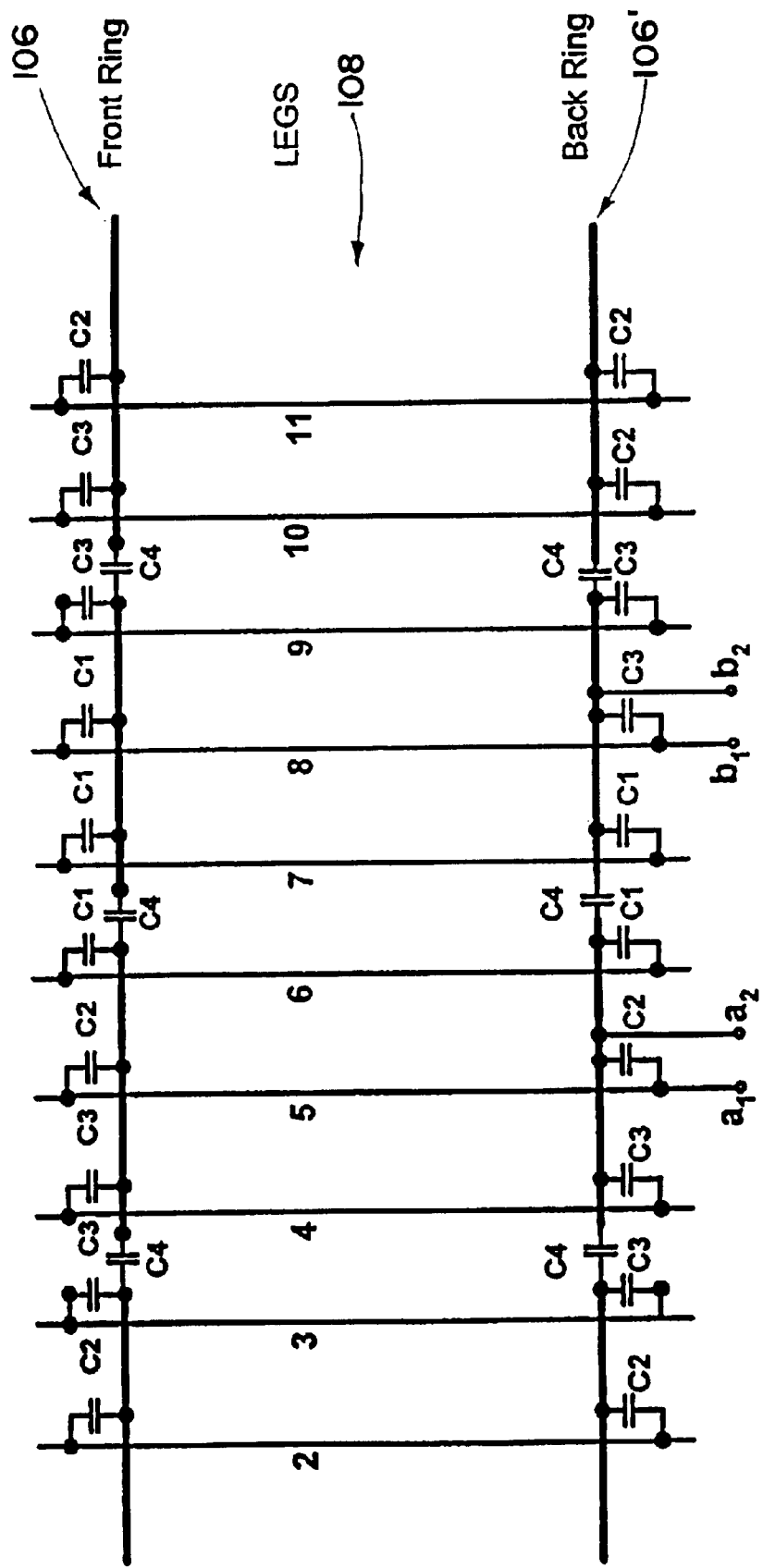
FIG. 9 is a planar schematic diagram of a low pass configuration of the neonate body coil of FIG. 8.

A planar schematic of a low-pass version of the coil of FIG. 8 is shown in FIG. 9. Capacitors C1, C2 and C3 are optimized to provide appropriate phase shifts through the individual sections of the coil for proper mode alignment of the principal modes (at ±45 degrees to the vertical axis) over the load necessary to achieve circular polarization (ideal quadrature operation and hence high S/N at the coil center) inside the coil volume over the imaging field of view (FOV). C4 is used to break the gradient induced eddy currents in the coil end rings 106, 106'. The driving points a1, a2, b1, b2 across capacitors on legs 5 and 8 are shown to illustrate the driving mechanism, which is explained in more detail with respect to FIG. 10A below.

FIG. 10A is a cross-sectional view of the front end-ring 106 showing the physical location of the legs 108 and alignment of the principal modes (I, II) used for homogeneous imaging. The two principal modes are oriented at ±45 degrees are driven likewise toward the bottom (a1, a2 & b1, b2) of the coil 100 across legs 5 and 8, respectively at ±45° to the vertical axis. To achieve a homogeneous field over the imaging FOV, the capacitors across legs 5 & 8 are driven using a push-pull (lead-lag) circuit 112, which is shown in more detail in FIG. 10B. The circuit 112 will insure that the drive is symmetric about the drive point (a1, b1 are at ±90 degrees from A, likewise b1, b2 are at ±90 degrees from B) which will also present a 180 degrees phase difference across the driven C2 capacitors.

The two matched 50 ohm outputs (A, B) are combined using a Wilkinson style power-splitter/combiner 3 dB quadrature combiner 114 and interfaced to the system transmitter (T) and MR system receiver via a low-noise figure (noise figure <0.5 dB) preamplifier. Schematics for the push-pull circuit 112 and quadrature hybrid 114 are similar to the schematic shown in FIG. 6B.

Embodiment #4

Design features for incubator compatibility are similar to that described for the neonate head coil 10. A cross-sectional view of the neonate body coil 100 inside an MR compatible incubator 120 of Lonnekker is shown in FIG. 11 to illustrate the arrangement and clearances. For the present version of the incubator 120, the body coil 100 is designed as the largest coil that can fit easily in and out of the incubator. Coil entry and exit is through a portal located in the rear door of the incubator (not shown). This way the patient is left undisturbed during coil placement and deployment. The neonate base 102 described above for the stand-alone case is replaced with a similar base 102' inside the incubator with similar patient support and restraint mechanisms.

A low-pass configuration with two point feed mechanism was discussed above with respect to FIG. 9. At higher frequencies, e.g., 128 MHz (3 Tesla (T)), a low pass design may not be realizable since very low tuning capacitances (<10 pF) are used on the coil designs. At 3T, a high pass configuration may be employed which will result in reasonable tuning capacitance (e.g., between 15–200 pF) with appropriate voltages across the capacitors. Hence, low electric fields (no hot spots) in or near the capacitors are realized. Since intermediate values of capacitances are used, appropriate phase shifts are maintained in every coil section. Thus, circular polarization and hence optimum S/N can be achieved.

Planar schematic diagrams of high-pass versions of the neonate head and body coils are disclosed in FIGS. 12 and 13 and are discussed in more detail below.

Embodiment #5

Figure 12:
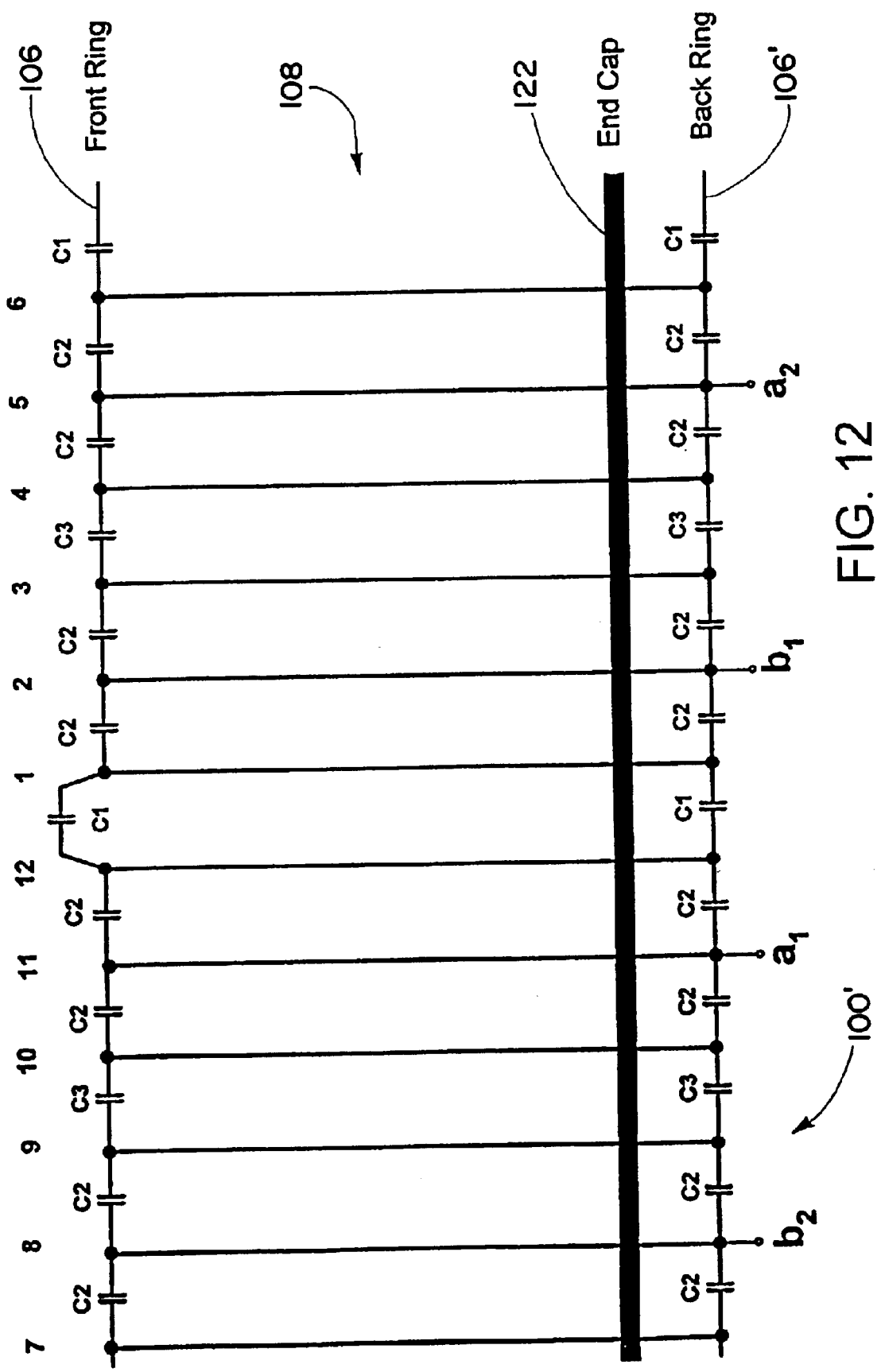
FIG. 12 is a planar schematic diagram of a neonate head coil in accordance with another embodiment of the present invention

Referring to FIG. 12, a planar schematic diagram of another embodiment of the neonate head coil 100' is shown. An end cap 122 includes a solid copper sheet that is slit into smaller sections and joined by several high value RF shorting capacitors to reduce gradient induced eddy currents. Thus, RF currents will flow undisturbed but intermediate frequency (IF) currents will be minimized. The distribution of the capacitances (C1, C2, C3) on the coil end rings 106, 106' provides appropriate phase shifts through the individual sections of the coil 100' for circular polarization and optimum coil performance. Driving mechanism for the high-pass neonate head coil 100' will be identical (principal modes at ±45 degrees to vertical axis) to that for the low-pass configuration of FIG. 6A. Connections to four point feed are made on legs 2, 5, 8 and 11 (a1, a2, b1 & b2) extending past the end cap 122.

Embodiment #6

Figure 10:
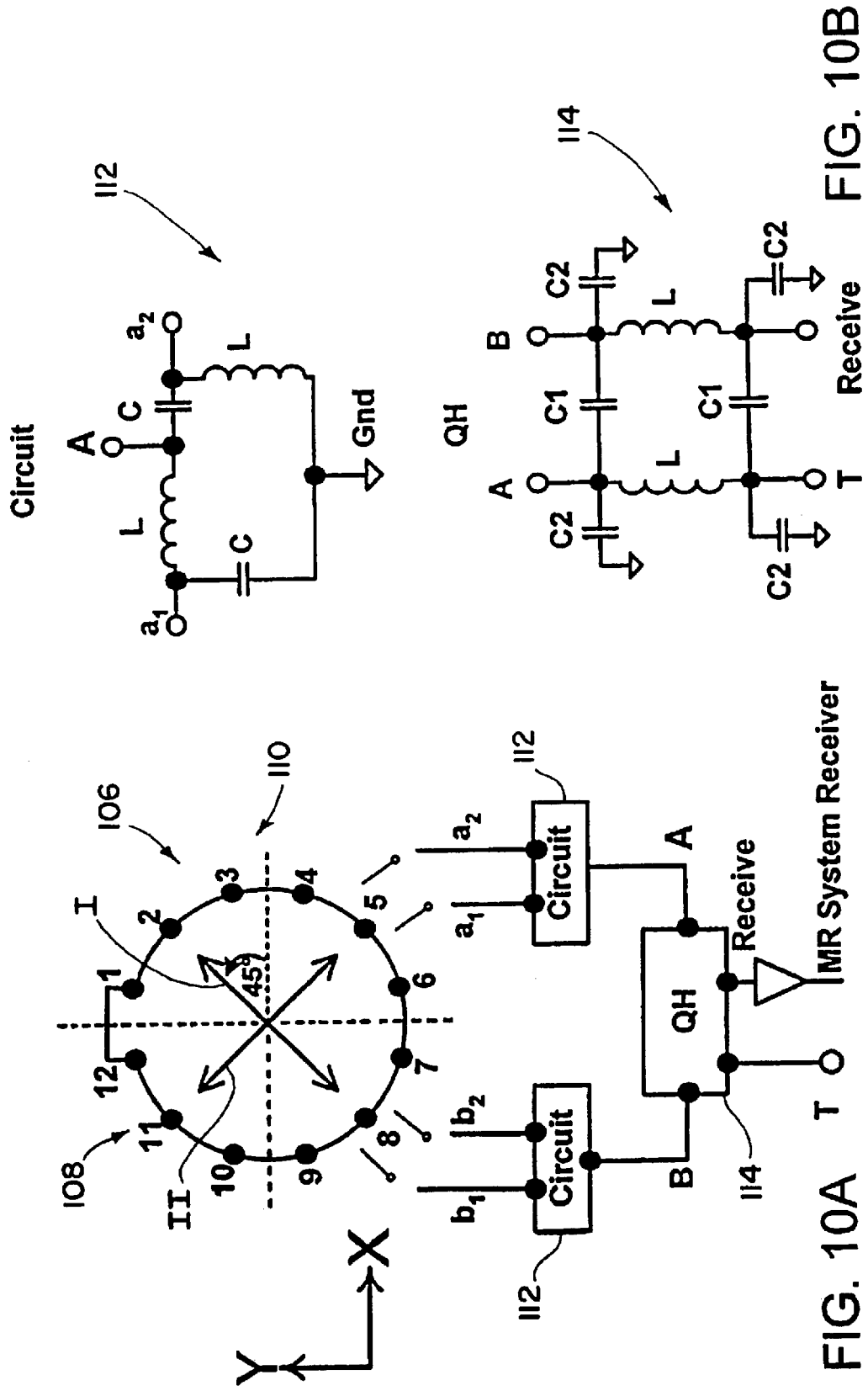
FIG. 10A is a cross sectional view of the front end ring of the body coil of FIG. 8.
FIG. 10B is a schematic diagram of a push-pull circuit and a quadrature hybrid combiner used in FIG. 10A in accordance with an embodiment of the present invention.
Figure 13:
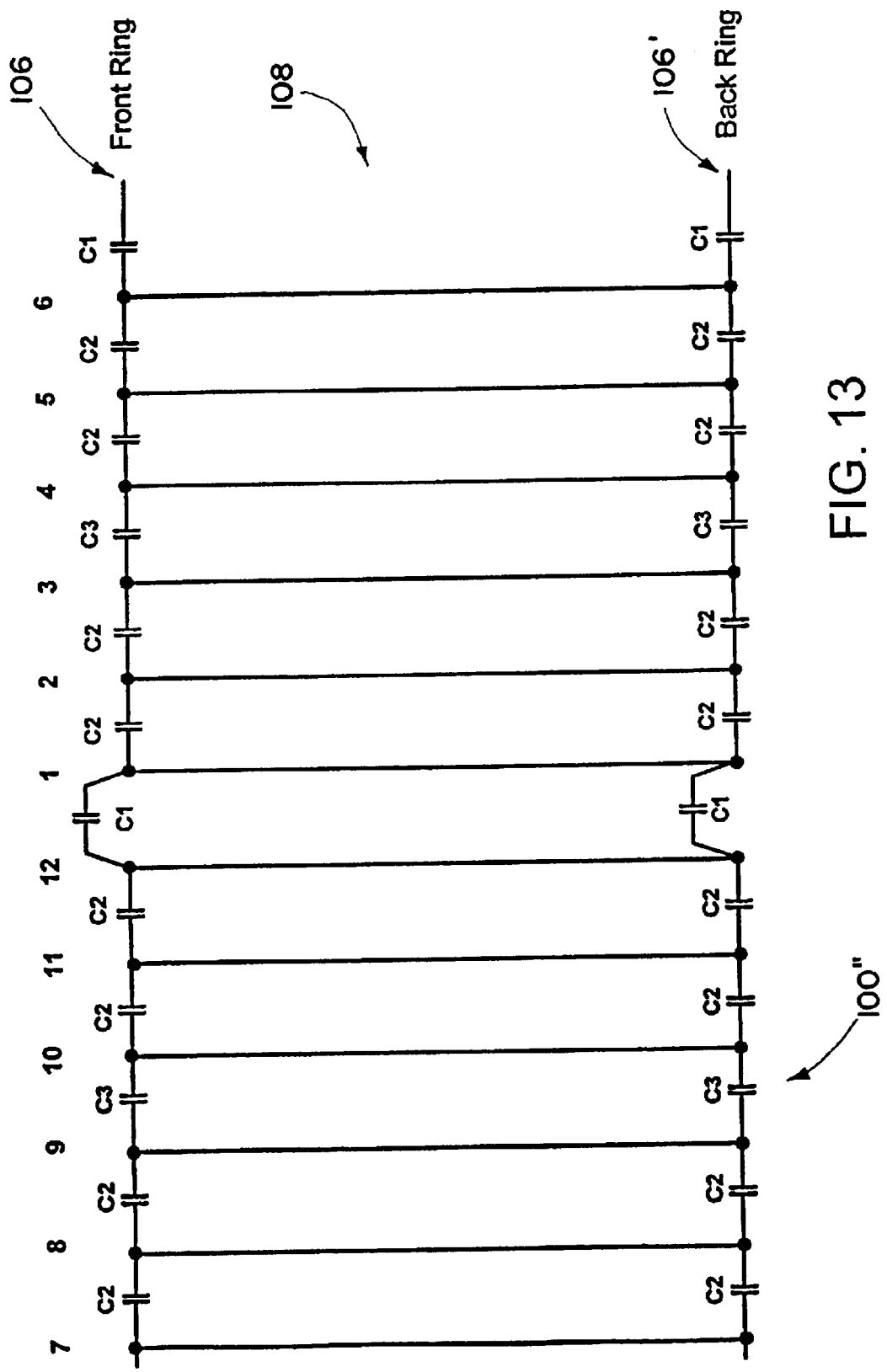
FIG. 13 is a planar schematic diagram of a neonate body coil in accordance with another embodiment of the present invention.

With reference to the planar schematic diagram of the neonate body coil 100" of FIG. 13, the two port feed driving mechanism will remain similar to that of the low-pass counterpart of FIG. 10. The mode orientations, however, can either be at +30 and −60 degrees or at ±45 degrees with respect to the vertical axis, respectively, depending where the voltages are tapped (across one C2 capacitor within a section or across two C2 tuning capacitors in neighboring sections) and impedances transformed to 50 ohms.

Matching mechanisms, transmit/receive (T/R) drives, signal combinations and interface to the MR system are identical to the low-pass versions for the high-pass coils.

Note, T/R coils of the high-pass and low-pass configurations are discussed above. Receive only versions of the neonate head and body coils are discussed in the following embodiment.

Embodiment #7

Active decoupling circuits are employed in all receive only coils to safely decouple them from the whole body coil during whole body transmit. Active decoupling enables the decoupling of the local receive only coil from the whole body coil during transmit. Decoupling of the receive only coil prevents distortion of the whole body RF field over the imaging FOV and prevents the possibility of patient RF burns caused by uneven RF fields, which commonly are referred to as "hot spots". Hot spots occur when high RF intensities are focused on small areas on the human body, and are similar to the effects of microwaves, except with hot spots the heating is caused at lower NMR frequencies in the RF range. Hot spots may cause RF burns because the specific absorption rates (SAR) over these focused areas significantly exceed the Food and Drug Administration's (FDA SAR) guidelines for RF power deposition.

By actively decoupling the local coil from the whole body coil, one can: a) significantly minimize the coupling effect between the two coils so there is no re-transmit of RF power by the local coil to the subject; and b) eliminate the possibility of RF burns to the subject.

During whole body transmit, the local coil is made transparent to the whole body RF so the subject receives a uniform transmit field. During receive however, the local coil is resonant while the whole body coil is decoupled and high NMR signals are received from the anatomy under investigation.

Circuit Description

Figure 14:
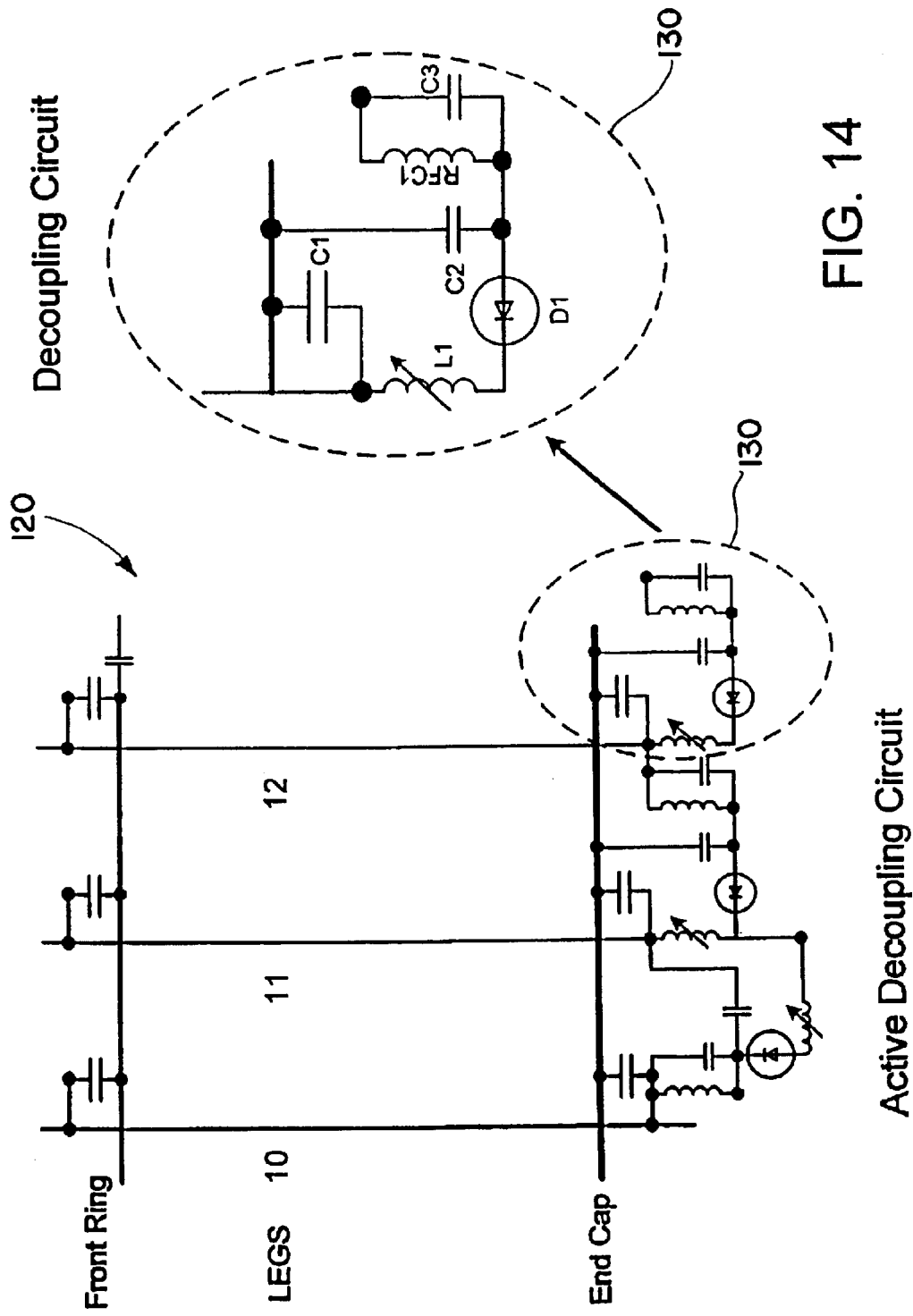
FIG. 14 is a partial schematic diagram of a low pass coil and an active switching decoupling circuit in accordance with another embodiment of the present invention.

High speed pin diodes and RF crossed-diodes can be used for switching in receive only coils. The neonate head and body coils are of the distributed design. Each neonate head and body coil described in this application, for example, has twelve sections and each section has a decoupling circuit intended to open every loop of the coil during transmit. A partial schematic of a coil 120 of a low-pass configuration is shown in FIG. 14. An active switching decoupling circuit 130 of one section is magnified for the sake of clarity.

During whole body transmit, the diode D1 is forward biased, which forms a high impedance (>2 K Ohms) trap circuit (L1-C2-C1) at the NMR frequency. This trap circuit blocks any circulating RF currents at the transmit frequency. Thus the coil 120 is made transparent to the incident whole body RF. C2 is a high value RF shorting capacitor and is used to isolate direct current (DC) from the coil and ground. The value of L1 is chosen to form a trap circuit at the NMR frequency with D1, C1 and C2.

During receive, diode D1 is reverse biased and the coil is resonant with C1 (since the trap circuit with L1-D1-C2 is now open circuit). The RF choke and C3 (RFC1 ∥C3 tuned the NMR frequency) is used to isolate the RF from the neighboring DC decoupling circuits on the coil 120. The coil has twelve active decoupling circuits and twelve RF chokes to isolate RF in the DC chain. The DC path in the coil approximates almost a full circle in the clockwise direction.

Failure Modes

Two conditions can exist with the diode failures. Diodes can Fail Open or Fail Closed. When one diode Fails Open, conventional MR systems will not recognize the coil (as it will check for a closed DC path at the coil regularly) and immediately stop whole body transmit. If the diode Fails Closed, then the coil will work well during transmit, but the resultant image will have artifacts ("dark spots") which can be easily picked up by the operator. Note, in the diode Fail Closed mode the coil is safe to use, but the image quality is affected. Thus, patient safety is not compromised in either case.

Although particular embodiments of the invention have been described in detail, it is understood that the invention is not limited correspondingly in scope, but includes all changes, modifications and equivalents coming within the spirit and terms of the claims appended hereto. For example, different configurations (low-pass, high-pass, band-pass, band-stop) of the embodiments are possible. Likewise, the coil can be driven using a two or a four port feed or using inductive coupling mechanisms to drive the principal or other modes of the coil to image. Several transmit/receive or receive only schemes also can be implemented. Further, one or more channels can be used to receive NMR signals in an array configuration. Different sealants and sealing methods can be used, and the coil may be useful for other applications where high temperatures, high humidity and high levels of oxygen exist. Other coil designs can be developed to image the object under investigation in an incubator or similar environment using resonance techniques (MR, NMR, etc.).

What is claimed is:

1. A radio frequency (RF) pediatric coil for magnetic resonance/imaging analysis, comprising:
   a first end ring having a generally annular opening;
   at least one of a second end ring or an end cap; and
   a plurality of elongated segments coupled to and positioned circumferentially around the generally annular opening of the first end ring and the at least one of the second end ring or the end cap to form a coil volume, wherein the generally annular opening has a general radius R about which the plurality of elongated segments are positioned, and includes an anterior extension extending radially beyond the general radius R to facilitate access into the coil volume.

2. The coil of claim 1, further comprising an opening in the anterior extension.

3. The coil of claim 2, wherein the opening in the anterior extension is a rectangular opening.

4. The coil of claim 1, wherein a first elongated segment and a second elongated segment of the plurality of elongated segments are spaced about the anterior extension to facilitate access into the coil volume.

5. The coil of claim 4, wherein the first elongated segment and the second elongated segment are spaced apart azimuthally at an angle greater than an azimuthal spacing of the remainder of the plurality of elongated segments.

6. The coil of claim 5, wherein the first elongated segment and the second elongated segment are spaced apart azimuthally by about 45 degrees.

7. The coil of claim 6, wherein the remainder of the plurality of elongated segments are spaced apart azimuthally by about 30 degrees.

8. The coil of claim 1, wherein the coil volume is selected to include at least one of a body size and a head size of a 95th percentile of newborn neonates up to three months in age.

9. The coil of claim 1, further comprising:
   a platform for restraining neonates, wherein the coil is operatively coupled to the platform to facilitate imaging of the neonates.

10. The coil of claim 1, wherein the anterior extension facilitates placement of at least one life sustaining line.

11. The coil of claim 1, wherein the coil can operate substantially unaffected in hostile environments.

12. The coil of claim 11, wherein the hostile environments include the group consisting of high temperature environment, high humidity environment and high oxygen content environment.

13. The coil of claim 1, wherein the coil is a stand alone coil.

14. The coil of claim 13, wherein the coil is a body coil.

15. The coil of claim 14, wherein the coil is configured in a high pass configuration.

16. The coil of claim 14, wherein the coil is configured in a low pass configuration.

17. The coil of claim 13, wherein the coil is a head coil.

18. The coil of claim 17, wherein the coil is configured in a high pass configuration.

19. The coil of claim 17, wherein the coil is configured in a low pass configuration.

20. The coil of claim 1, wherein the coil is operatively coupled to an incubator.

21. The coil of claim 20, wherein the coil is mounted inside the incubator.

22. The coil of claim 20, wherein the coil is a body coil.

23. The coil of claim 22, wherein the coil is configured in a high pass configuration.

24. The coil of claim 22, wherein the coil is configured in a low pass configuration.

25. The coil of claim 20, wherein the coil is a head coil.

26. The coil of claim 25, wherein the coil is configured in a high pass configuration.

27. The coil of claim 25, wherein the coil is configured in a low pass configuration.

28. The coil of claim 1, further comprising an active decoupling circuit to decouple a receive portion of the coil during a transmit.

29. The coil of claim 28, wherein the active decoupling circuit is operatively coupled to each of the plurality of elongated segments.

30. The coil of claim 28, wherein the active decoupling circuit opens each loop of the coil during the body transmit.

31. An imaging system for magnetic resonance imaging/analysis of a neonate, comprising:
an incubator;
a platform for restraining the neonate, said platform residing within the incubator; and
the coil of claim 1, wherein the coil is operatively coupled to the platform to facilitate positioning of the coil relative to the neonate.

32. A head coil, comprising:
an end cap;
an end ring;
a plurality of legs connecting the end cap to the end ring, wherein the plurality of legs are spaced apart azimuthally by 45 degrees; and
a plurality of drive points, wherein the drive points are bridged using a push-pull configuration.

33. The head coil of claim 32, further comprising:
a plurality of outputs, wherein the outputs are combined with a 3 dB quadrature hybrid converter.

34. The head coil of claim 32, where an anterior portion of the end ring includes an access way to allow placement of human diagnostic connections.

35. A radio frequency (RF) pediatric coil for magnetic resonance/imaging analysis, comprising:
a first end ring having a generally annular opening;
at least one of a second end ring or an end cap; and
a plurality of elongated segments coupled to and positioned circumferentially around the generally annular opening of the first end ring and the at least one of the second end ring or the end cap to form a coil volume, wherein a first elongated segment and a second elongated segment of the plurality of elongated segments are spaced apart azimuthally at an angle greater than an azimuthal spacing of the remainder of the plurality of elongated segments to facilitate access into the coil volume.

* * * * *